(12) United States Patent
Ovadia et al.

(10) Patent No.: US 10,579,761 B1
(45) Date of Patent: Mar. 3, 2020

(54) METHOD AND SYSTEM FOR RECONSTRUCTING A GRAPH PRESENTATION OF A PREVIOUSLY EXECUTED VERIFICATION TEST

(71) Applicant: Cadence Design Systems, Inc., San Jose, CA (US)

(72) Inventors: Meir Ovadia, Rosh Ha-Ayin (IL); Talia Leah Orztizer, Bnei Brak (IL)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/232,043

(22) Filed: Dec. 25, 2018

(51) Int. Cl.
*G06F 17/50* (2006.01)
*G06F 16/901* (2019.01)

(52) U.S. Cl.
CPC ........ *G06F 17/504* (2013.01); *G06F 16/9024* (2019.01)

(58) Field of Classification Search
USPC ........................................................ 716/111
See application file for complete search history.

(56) References Cited

U.S. PATENT DOCUMENTS 7,444,574 B2 * 10/2008 Davis ............... G01R 31/31917
703/13

* cited by examiner

*Primary Examiner* — Eric D Lee
(74) *Attorney, Agent, or Firm* — Pearl Cohen Zedek Latzer Baratz LLP

(57) ABSTRACT

A method for reconstructing a graph representation of a previously executed verification test, may include obtaining a truncated chronicle of start time and end time messages of actions of the verification test that were logged during execution of the verification test on a design under test (DUT); using a processor, parsing and analyzing the start time and the end time messages to determine an order of the actions; using a processor, determining an order of other actions of said verification test, based on a graph representation of a verified scenario from which the verification test was generated; and reconstructing the graph representation of the verification test based on the determined order of the actions and order of the other actions.

20 Claims, 5 Drawing Sheets

METHOD AND SYSTEM FOR RECONSTRUCTING A GRAPH PRESENTATION OF A PREVIOUSLY EXECUTED VERIFICATION TEST

FIELD OF THE INVENTION

The present invention relates to verification and more particularly to method and system for reconstructing a graph representation of a previously executed verification test.

BACKGROUND OF THE INVENTION

Design verification is a common process for testing a newly designed integrated circuit, board, or system-level architecture, to, for example, confirm that it complies with the requirements defined by the specification of the architecture for that device. Design verification for a device under test (DUT) may be performed on the actual device, but can usually be a simulation model of the device is tested.

Verification of electronic designs typically has three forms. At an early stage, before the electronic design is implemented in hardware, simulation can be conducted on a model of the design. Another form can be emulation, in which one electronic hardware is used to mimic the behavior of another (tested) electronic hardware. At more advanced stages of design development a system on chip can be validated, in a process which is typically referred to as post-silicon verification. Post-silicon verification can be a last stage in the electronic design development, for example, before it is manufactured.

Post-silicon verification tests can be carried out on actual devices running at speed on realistic system boards, the results of which can be assessed by a logic analyzer and other verification tools.

In a typical verification process an electronic design undergoes testing which includes designing various validated testing scenarios which are generated as code and executed.

Verification tests typically include a plurality of actions that are to be executed, in order to test the validity of the DUT planned design.

Current post-process debugging methods include a method which involves recording a specific program execution and allowing an on-line or off-line analysis of that execution. In this method, when recording the execution, typically all execution events that occurred in are saved.

An "execution event", typically refers to any event that has occurred during the execution of the program, and may include, for example, a code line that was executed, a routine that was called, a parameter that was calculated, a variable that has been assigned a value, a status of a computing environment, an indication (e.g., text, line, or location within a source code representation or other representation of the software program being debugged, a function currently being executed, an instruction that called the function being currently executed, or other indication) of an instruction that is being executed or that was most recently executed, an address of a variable or instruction, or other relevant information that may be displayed or otherwise made available to a user of the debugging tool, etc.

Information relating to the execution events encountered during an execution can be saved (e.g., into a database, memory, etc.), allowing the review of the recorded execution in a user interface while mimicking the look and feel of a regular debugging tool. Thus, the human user (hereinafter—user) can go back and forth (up to the last execution event that was recorded) and view various execution events of that specific execution, including the related information of these events. Using such a post-process debug method can allow the user to analyze any execution event and/or find the execution events that caused it to occur the way it did.

A post process debugger typically records information relating to a specific execution of a program under test and is designed to utilize that information so as to mimic a look and feel of a "regular" debugger. Using the saved information, the post process debugger may show all the instances in which a given code line was executed, and what were the values of the variables, parameters and/or other fields found in a code line or in the scope of that code line for each instance. The post process debugger may also record all the messages that were printed while running the program, and may have a specially designated graphical user interface (GUI) that presents these messages and allows filtering them in one or various ways.

SUMMARY OF THE INVENTION

There is thus provided, according to some embodiments of the present invention, a method for reconstructing a graph representation of a previously executed verification test. The method includes obtaining a truncated chronicle of start time and end time messages of actions of the verification test that were logged during execution of the verification test on a design under test (DUT). The method also includes using a processor, parsing and analyzing the start time and the end time messages to determine an order of the actions. The method also includes using a processor, based on a graph representation of a verified scenario from which the verification test was generated, determining an order of other actions of said verification test; and reconstructing the graph representation of the verification test based on the determined order of the actions and order of the other actions.

According to some embodiments of the present invention, the method also includes automatically implanting print commands for the start time and end time messages in a test code of the verification test.

According to some embodiments of the present invention, the truncated chronicle was previously saved to a circular buffer.

According to some embodiments of the present invention, the method also includes executing the verification test.

According to some embodiments of the present invention, the method also includes saving the start time and end time messages of the actions of the verification test to a circular buffer.

According to some embodiments of the present invention, the verification test is a post-silicon verification test.

According to some embodiments of the present invention, the method also includes causing the graph representation of the verification test to be displayed on a display device.

According to some embodiments of the present invention, there is also provided a non-transitory computer readable storage medium for reconstructing a graph representation of a previously executed verification test, having stored thereon instructions that when executed by a processor will cause the processor to: obtain a truncated chronicle of start time and end time messages of actions of the verification test that were logged during execution of the verification test on a design under test (DUT); parse and analyze the start time and the end time messages to determine an order of the actions; based on a graph representation of a verified scenario from which the verification test was generated, determine an order of other actions of said verification test; and reconstruct the graph representation of the verification test based on the determined order of the actions and order of the other actions.

According to some embodiments of the present invention, there is also provided a system for reconstructing a graph representation of a previously executed verification test. The system includes a memory and a processor configured to: obtain a truncated chronicle of start time and end time messages of actions of the verification test that were logged during execution of the verification test on a design under test (DUT); parse and analyze the start time and the end time messages to determine an order of the actions; based on a graph representation of a verified scenario from which the verification test was generated, determine an order of other actions of said verification test; and reconstruct the graph representation of the verification test based on the determined order of the actions and order of the other actions.

BRIEF DESCRIPTION OF THE DRAWINGS

In order to better understand the present invention, and appreciate its practical applications, the following figures are provided and referenced hereafter. It should be noted that the figures are given as examples only and in no way limit the scope of the invention. Like components are denoted by like reference numerals.

DETAILED DESCRIPTION OF EMBODIMENTS OF THE INVENTION

Figure 1A:
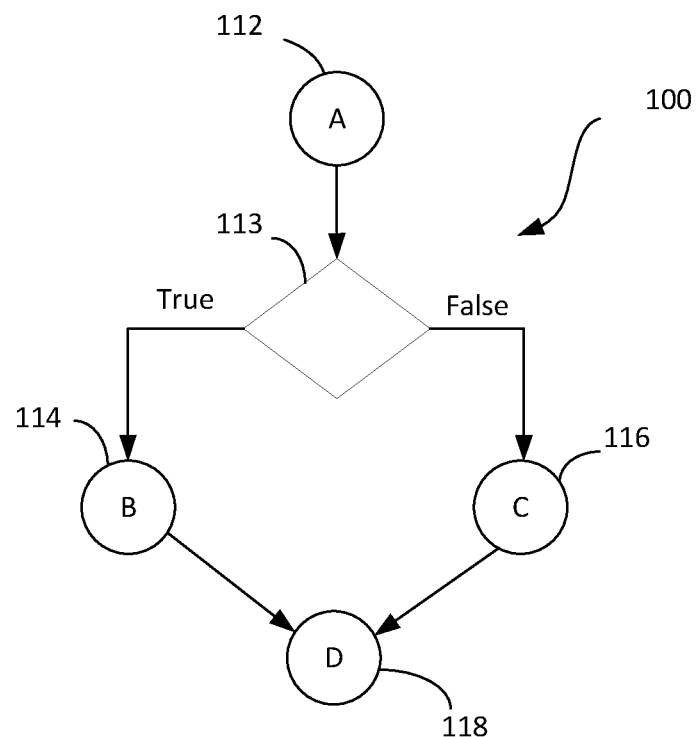
FIG. 1A shows an example of a validated scenario (sometimes referred to as a "solution"), which is a graph representation of a verification test.

In the following detailed description, numerous specific details are set forth in order to provide a thorough understanding of the methods and systems. However, it will be understood by those skilled in the art that the present methods and systems may be practiced without these specific details. In other instances, well-known methods, procedures, and components have not been described in detail so as not to obscure the present methods and systems.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

An electronic system (e.g., a smartphone) may typically be made up of a plurality of electronic devices (e.g., memory, camera, central processing unit—CPU, graphical processing unit—GPU, microphone, media player, etc.). At the early stages in the development of electronic design, a model of each of the electronic devices that form the electronic system can be built (typically in Verilog or other HDL language and verified, by simulating executions of a multitude of tests on the on a simulation of the device under test (DUT). In order to, for example, efficiently cover all (or substantially all) functionalities of the DUT a plurality of tests can be generated. The plurality of tests can be pieces of code, e.g., C-code, assembly, and/or other codes as are known in the art. Each of the plurality of tests can be generated from one of various scenarios which can be constructed by a one or a plurality of users. Each scenario can be made up of a plurality of actions which the user selects to be included in the scenario. The user may also define the order in which the selected actions are to be performed—consecutively or concurrently.

An electronic design automation (EDA) tool was introduced (e.g., a system verifier) that allows a user to view and work on a graph representation of a scenario or to construct and rearrange the scenario by dragging actions (actually symbols of such actions) from a set of available actions into a designated space in a graphical user interface, to form a graph representation of a desired verification test, defining the relations between the selected actions (the order in which they are to be performed—e.g., sequentially or in parallel), to define a scenario. Typically, the graph representation of the scenario is a directed graph, where actions of the scenario are vertices (nodes) and are connected by directed edges.

A scenario may include, for example, a set of actions put together by a verification expert (hereinafter—"user") in a graph representation form, that is eventually converted into target code file and used for testing the DUT.

Such an EDA tool may be used in the construction of verification tests and in verifying that these test comply with various constraints and system requirements.

A validated scenario—that appears to comply with system requirements and with test constraints—may then be converted by the EDA tool into a test by generating a target code file, which is an executable code, such as, for example, C-code or Assembly. That test may be fed to the DUT in the verification process to test its design.

Working on a graph representation may make it easier for the human user to see and understand relations between actions and may consequently increase the efficiency and productivity of a debug expert to work with verification tests.

In the generation process of verification tests, using an EDA tool working with graph representation form, the EDA tool may automatically implant various messages (e.g., printout information relating to the test) in the generated target code file, which is designed to help the user understand the logical flow and statuses of the test. When the test is executed, a log file may be generated that includes these messages, and the user may view these messages in order to verify a proper execution or to discover flaws or bugs. These messages offer the user information on what happened and when during the execution of the test.

Typically, in post-silicon verification, the verification test is substantially greater than a verification test used in simulation, as it usually includes many tests that were designed to test various features and functions of a DUT (typically much greater than the DUT tested in simulation) and also tests designed to test the overall design (e.g., how the features and functions work together).

Typically, the execution speed in post-silicon verification processes is substantially greater than the speed at which a verification test runs in a simulation, yet memory buffer resources are much scarcer in post-silicon verification than in simulation.

Debugging professionals typically use a plurality of print commands, e.g., print f (print command in C language), Cout (print command in C++), out (print command in E), etc. which are implanted in a test code, and are designed to print debugging messages containing information relating to the execution (e.g., values of one or more variables in a particular code line or lines, a time stamp indicating the time of execution of a particular action, etc.) where each of these print commands is planted in a code to be debugged, so that when the execution path crosses such a print command, a message containing the related information is printed into a log file that chronologically logs these messages. A debugging professional may use the log file with these messages in post-process debugging to track the execution path and detect anomalies or execution events that require their attention.

FIG. 1A shows an example of a validated scenario (sometimes referred to as a "solution", or a "verification test" once generated into test code form), which is a graph representation of a verification test (e.g., for post-silicon verification). Validated scenario 100 includes action A 112, action B 114, action C 116 and action D 118. Action A 112 is to be executed first, after which a decision 113 has to be determined, e.g., whether a certain statement is true or false. For example, if true, then action B 114 follows and when action B 114 is completed action D 118 is executed. In the event of false, action C 116 follows action A 112, and when completed action D 118 is executed.

Figure 1B:
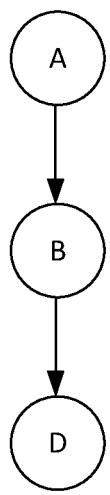
FIG. 1B shows a graph representation of an example of an execution run of a verification test that was generated from the validated scenario of FIG. 1A.

If a certain execution run of the test that was generated form validated scenario had a "false" decision then a graph representation of the recorded execution would include a serial arrangement of actions A 112, C 116 and D 118, whereas if that decision turned back "true" the graph representation of that execution run would include a serial arrangement of actions A 112, B 114, and D 118, as illustrated in FIG. 1B.

Figure 1C:
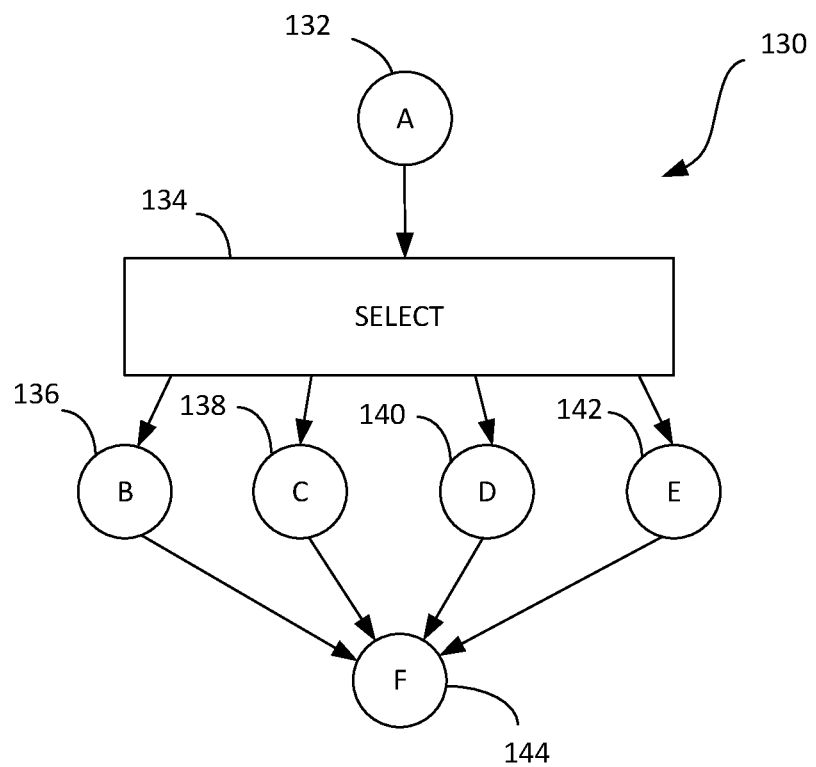
FIG. 1C shows a graph representation of an example of a validated scenario of a verification test with a "select" decision, which determines, given a certain condition is met which path the execution is to take (e.g., what is the next action of a plurality of actions to be executed).

Another example is shown in FIG. 1C, showing a graph representation of an example of a validated scenario 130 with a "select" decision, which determines, given a certain condition is met which path the execution is to take (e.g., what is the next action, of a plurality of actions, to be executed next). In this example, action A 132 is to be executed first, followed by a "select" decision 134, which based on the compliance with certain conditions selects the next action, which in this example may be action B 136, action C 138, action D 140 or action E 142. Each of these actions—action B 136, action C 138, action D 140 or action E 142—is to be followed by action F 144.

Figure 1D:
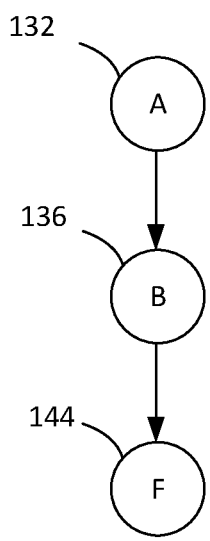
FIG. 1D shows a graph representation of an example of an execution run of a verification test that was generated from the validated scenario of FIG. 1C.

FIG. 1D shows a graph representation of an example of an execution run of a verification test that was generated from the validated scenario of FIG. 1C. In this particular execution run action A 132 was executed, and the "select" decision 134 selected the next action to be action B 136, followed by action F 144.

Other examples may include validated scenarios with repeat commands, that cause an action or a chain of actions to be repeated (e.g., in a predetermined number of repeats or continuous repeat until a certain condition is met, for example when another action is completed, etc.)

In post-silicon verification, during the execution of a verification test, debugging messages are typically saved to a memory buffer, using circular buffering, which keeps adding new data (e.g., a new message or a plurality of new messages) to the circular buffer until the memory buffer is full, after which old data (e.g., an old message, or a plurality of old messages) is deleted to allow saving the next new data.

The saved messages of a particular execution run of a verification test in the circular buffer may be then considered, to reconstruct a graph representation of the verification test as it was actually executed in that particular execution run.

For example, for each action print commands may be dedicated in the test code so as to print a message indicating a start time of an action and a message indicating an end time of that action. The EDA tool may parse and analyze these logged messages to determine the actual order of execution of the actions in the executed test.

For example, if the start time and the end time of a certain action precede the start time of another action it is clear that the first action and the second action were performed in a consecutive manner, so a line may be drawn in the reconstructed graph representation of the actual execution of the verification test. If, on the other hand, the start time of a first action is followed by the start time of a second action before the end time of the first action or vice versa, these two actions were executed concurrently and will therefore be linked in parallel in the reconstructed graph representation of that actual execution of the verification test.

In some embodiments of the present invention, The EDA tool may be designed to allow a user to choose what kind of graph representation is to be presented on a display device for the user to review this graph.

However, the reconstruction of a graph representation of the actual execution run of a verification test may not be simple, in the case of partial log, owing to the circular buffer limitations, which may provide only partial information that constitutes a truncated chronicle, which includes a list of start and end messages of actions of the verification test from which the actual chain of actions may be determined. The truncated chronicle may miss out start and/or end messages of early actions, that were deleted form the circular buffer to make room for later messages, and/or it may miss out start and/or end messages of later actions, that were not yet executed at the time the logging of the start and end time messages had stopped (e.g., in case of an early termination of the execution, before the entire verification test was executed).

According to some embodiments of the present invention a method for reconstructing a graph representation of a verification test, based on a truncated chronicle of printed start and end times of actions of that verification test that were executed, and on the graph representation of a validated scenario from which the verification test was generated.

Figure 2:
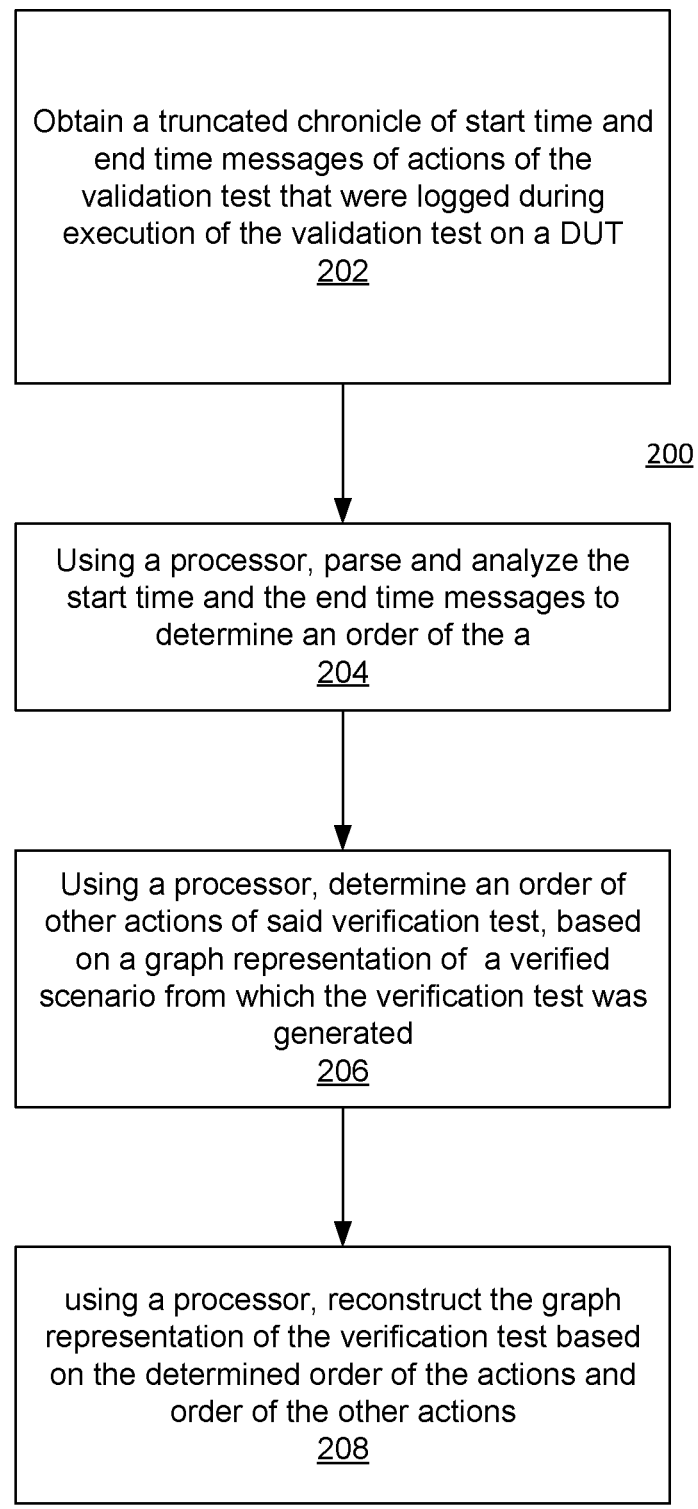
FIG. 2 is a diagram of a method for reconstructing a graph representation of a previously executed verification test, according to some embodiments of the present invention.

FIG. 2 shows a flow chart of a method for reconstructing a graph representation of a verification test, according to some embodiments of the present invention. Method 200 may include obtaining a truncated chronicle of start time and end time messages of actions of the verification test that were logged during execution of the verification test on a design under test (DUT).

Method 200 may also include, using a processor, parsing and analyzing 204 the start time and the end time messages to determine an order of the actions.

Method 200 may also include, using a processor, determining 206 an order of other actions of said verification test, based on a graph representation of a verified scenario from which the verification test was generated, and, using a processor, reconstructing 208 the graph representation of the verification test based on the determined order of the actions and order of the other actions.

In some embodiments of the present invention, the method includes automatically implanting print commands for the start time and end time messages in a test code of the verification test In some embodiments of the present invention, the truncated chronicle was saved to a circular buffer.

In some embodiments of the present invention, the method further includes executing the verification test.

In some embodiments of the present invention, the method further includes saving the start time and end time messages of the actions of the verification test to a circular buffer.

In some embodiments of the present invention, the verification test is a post-silicon verification test.

In some embodiments of the present invention, the method includes causing the graph representation of the verification test to be displayed on a display device.

Figure 3:
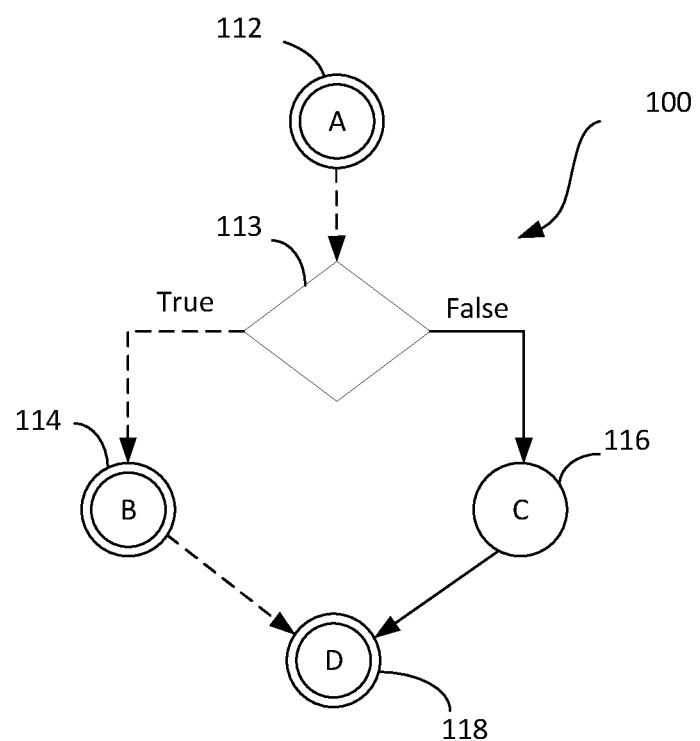
FIG. 3 is a reconstructed graph representation of an actual execution of the verification test, according to some embodiments of the present invention.

FIG. 3 is a graph representation of the actual execution run of the verification test of FIG. 1A, according to some embodiments of the present invention. Actions and their links, based on information that was retrieved from the truncated chronicle of start and end times messages may be uniquely indicated, for example, by uniquely marking these actions and links, e.g., by dual lines, as shown in this figure, and their relevant arcs, e.g., dashed lines, as shown in this figure. Other unique markings such as differentiating the actions and links retrieved from the truncated chronicle of messages by indicating them in a different color than the color indicating the other actions and links of the verified scenario.

Some embodiments of the present invention are aimed at allowing the debugging expert a clearer understanding of what actually occurred during a certain execution run of a verification test that tested a DUT, in post process debugging. Typically, to date, post process debugging professionals refer to the DUT model and the log file as input and tend to ignore the graph representation of the verification test (in fact many EDA tools do not provide graph representations of the verification test. Debugging experts often tend to concentrate on and work on the target language code file directly avoiding the creating a solution graph, thus missing the possibility of viewing a graph which offers visual understanding that may help the debugging expert find anomalies and bugs faster and facilitate speeding up of the debugging process.

The more complicated the execution path is (e.g., repeats, selection of a single execution path of a plurality of optional paths) the simpler and faster it may be for debugging experts to understand the actual execution path by reconstructing the graph representation, based on an actual execution run of a verification test, according to some embodiments of the present invention.

Figure 4:
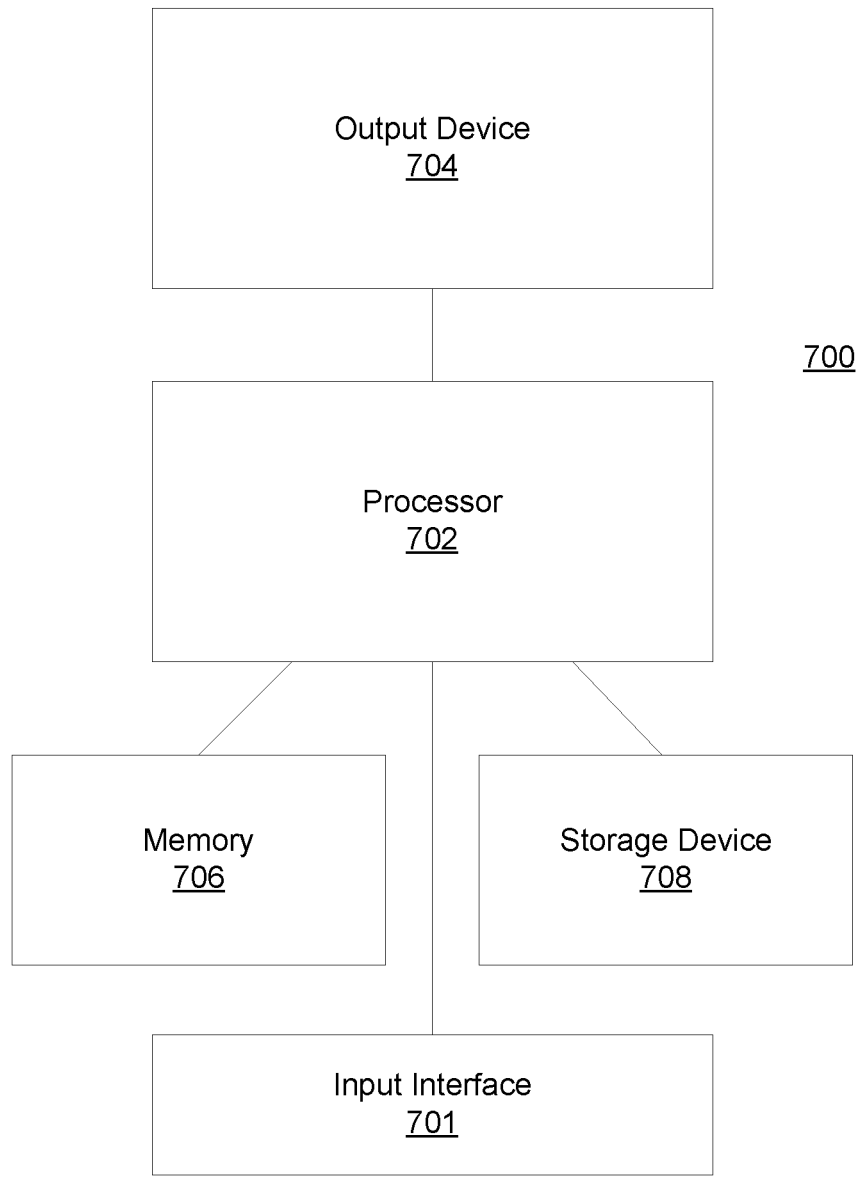
FIG. 4 is a system for reconstructing a graph representation of a previously executed verification test, according to some embodiments of the present invention.

FIG. 4 is a system for reconstructing a graph representation of a previously executed verification test, according to some embodiments of the present invention. System 700 may include a processor 702 (e.g. single processor or a processing unit made that includes a plurality of processors, on a single machine or distributed on a plurality of machines) for executing a method according to some embodiments of the present invention. Processing unit 702 may be configured to obtain a truncated chronicle of start time and end time messages of actions of the validation test that were logged during execution of the validation test on a design under test (DUT); to parse and analyze the start time and the end time messages to determine an order of the actions; based on a graph representation of a verified scenario from which the verification test was generated, to determine an order of other actions of said verification test; and to reconstruct the graph representation of the verification test based on the determined order of the actions and order of the other actions, and perform other actions and processing according to some embodiments of the present invention.

Processor 702 may be linked with memory 706 on which a program implementing a method according to some embodiments of the present invention and corresponding data may be loaded and run from, and storage device 708, which includes a non-transitory computer readable medium (or mediums) such as, for example, one or a plurality of hard disks, flash memory devices, etc. on which a program implementing a method according to some embodiments of the present invention and corresponding data may be stored. System 700 may further include an output device 704 (e.g. display device such as CRT, LCD, LED etc.) on which one or a plurality user interfaces associated with a program implementing a method according to some embodiments of the present invention and corresponding data may be presented. System 700 may also include input interface 701, such as, for example, one or a plurality of keyboards, pointing devices, touch sensitive surfaces (e.g. touch sensitive screens), etc. for allowing a user to input commands and data.

Some embodiments of the present invention may be embodied in the form of a system, a method or a computer program product. Similarly, some embodiments may be embodied as hardware, software or a combination of both. Some embodiments may be embodied as a computer program product saved on one or more non-transitory computer readable medium (or media) in the form of computer readable program code embodied thereon. Such non-transitory computer readable medium may include instructions that when executed cause a processor to execute method steps in accordance with examples. In some examples the instructions stores on the computer readable medium may be in the form of an installed application and in the form of an installation package.

Such instructions may be, for example, loaded by one or more processors and get executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer system, or on a plurality of computer systems.

Some embodiments are described hereinabove with reference to flowcharts and/or block diagrams depicting methods, systems and computer program products according to various embodiments.

Features of various embodiments discussed herein may be used with other embodiments discussed herein. The foregoing description of the embodiments has been presented for the purposes of illustration and description. It is not intended to be exhaustive or limiting to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes that fall within the true spirit of the present invention.

The invention claimed is:

1. A method for reconstructing a graph representation of a previously executed verification test, the method comprising:
    obtaining a truncated chronicle of start time and end time messages of actions of the verification test that were logged during execution of the verification test on a design under test (DUT);
    using a processor, parsing and analyzing the start time and the end time messages to determine an order of the actions;
    using a processor, determining an order of other actions of said verification test, based on a graph representation of a verified scenario from which the verification test was generated; and
    reconstructing the graph representation of the verification test based on the determined order of the actions and order of the other actions.

2. The method of claim 1, further comprising automatically implanting print commands for the start time and end time messages in a test code of the verification test.

3. The method of claim 1, wherein the truncated chronicle was previously saved to a circular buffer.

4. The method of claim 1, further comprising executing the verification test.

5. The method of claim 4, further comprising saving the start time and end time messages of the actions of the verification test to a circular buffer.

6. The method of claim 4, wherein the verification test is a post-silicon verification test.

7. The method of claim 1, further comprising causing the graph representation of the verification test to be displayed on a display device.

8. A non-transitory computer readable storage medium for reconstructing a graph representation of a previously executed verification test, having stored thereon instructions that when executed by a processor will cause the processor to:
    obtain a truncated chronicle of start time and end time messages of the verification test that were logged during execution of the verification test on a design under test (DUT);
    parse and analyze the start time and the end time messages to determine an order of the actions;
    determine an order of other actions of said verification test based on a graph representation of a verified scenario from which the verification test was generated; and
    reconstruct the graph representation of the verification test based on the determined order of the actions and order of the other actions.

9. The non-transitory computer readable storage medium of claim 8, having stored thereon instructions that when executed by a processor will cause the processor to automatically implant print commands for the start time and end time messages in a test code of the verification test.

10. The non-transitory computer readable storage medium of claim 8, wherein the truncated chronicle was previously saved to a circular buffer.

11. The non-transitory computer readable storage medium of claim 8, having stored thereon instructions that when executed by a processor will cause the processor to execute the verification test.

12. The non-transitory computer readable storage medium of claim 11, having stored thereon instructions that when executed by a processor will cause the processor to save the start time and end time messages of the actions of the verification test to a circular buffer.

13. The non-transitory computer readable storage medium of claim 8, wherein the verification test is a post-silicon verification test.

14. The non-transitory computer readable storage medium of claim 8, having stored thereon instructions that when executed by a processor will cause the processor to cause the graph representation of the verification test to be displayed on a display device.

15. A system for reconstructing a graph representation of a previously executed verification test, the system comprising:
    a memory and
    a processor configured to:
    obtain a truncated chronicle of start time and end time messages of actions of the verification test that were logged during execution of the verification test on a design under test (DUT);
    parse and analyze the start time and the end time messages to determine an order of the actions;
    determine an order of other actions of said verification test, based on a graph representation of a verified scenario from which the verification test was generated; and
    reconstruct the graph representation of the verification test based on the determined order of the actions and order of the other actions.

16. The system of claim 15, wherein the processor is further configured to automatically implant print commands for the start time and end time messages in a test code of the verification test.

17. The system of claim 15, wherein the memory comprises a circular buffer and wherein the truncated chronicle was previously saved to the circular buffer.

18. The system of claim 15, wherein the processor is further configured to execute the verification test.

19. The system of claim 18, wherein the processor is further configured to save the start time and end time messages of the actions of the verification test to a circular buffer.

20. The system of claim 15, further comprising a display device and wherein the processor is further configured to cause the graph representation of the verification test to be displayed on the display device.

* * * * *